(12) United States Patent
Terada et al.

(10) Patent No.: US 7,337,939 B2
(45) Date of Patent: Mar. 4, 2008

(54) BONDING APPARATUS

(75) Inventors: Touru Terada, Ishikawa (JP); Yasuhisa Matsumoto, Ishikawa (JP)

(73) Assignee: Shibuya Kogyo Co., Ltd, Ishikawa (JP)

( * ) Notice: Subject to any disclaimer, the term of this patent is extended or adjusted under 35 U.S.C. 154(b) by 0 days.

(21) Appl. No.: 11/236,594

(22) Filed: Sep. 28, 2005

(65) Prior Publication Data

US 2006/0022019 A1    Feb. 2, 2006

Related U.S. Application Data

(62) Division of application No. 10/015,691, filed on Dec. 17, 2001, now abandoned.

(30) Foreign Application Priority Data

Dec. 27, 2000    (JP)    ............ P. 2000-397163

(51) Int. Cl.
*B23K 31/00*    (2006.01)
(52) U.S. Cl. .............. 228/102; 228/103; 228/105
(58) Field of Classification Search .......... 228/103, 228/9, 104, 105, 44.7
See application file for complete search history.

(56) References Cited

U.S. PATENT DOCUMENTS

| | | | |
|---|---|---|---|
| 4,671,446 A | 6/1987 | Sherman | |
| 4,675,993 A | 6/1987 | Harada | |
| 5,803,341 A | 9/1998 | Abe | |
| 6,193,132 B1 | 2/2001 | Shibata et al. | |
| 6,337,489 B1 | 1/2002 | Matsumoto et al. | |
| 6,581,817 B2 * | 6/2003 | Kawashima et al. | 228/6.2 |
| 7,058,216 B2 * | 6/2006 | Kawada | 382/146 |
| 2003/0046812 A1 * | 3/2003 | Terada et al. | 29/833 |

FOREIGN PATENT DOCUMENTS

| | | | |
|---|---|---|---|
| JP | 401227443 A | * | 9/1989 |
| JP | 6-69286 | | 3/1994 |
| JP | 09115931 A | * | 5/1997 |

\* cited by examiner

*Primary Examiner*—Kiley Stoner
(74) *Attorney, Agent, or Firm*—Sughrue Mion, PLLC

(57) ABSTRACT

A bonding apparatus is constituted by a bonding tool, a substrate stage, a moving mechanism for moving the bonding tool and the substrate stage, an up-and-down mechanism for moving up and down said bonding tool, and a chip recognition camera. The bonding apparatus is configured so that a chip and a substrate are subjected to positioning on the basis of a recognition result of the chip recognition camera so that the chip is bonded onto the substrate. The chip recognition camera is disposed to be lower than a level of a substrate mounted surface of the substrate stage. A lower surface of the chip is recognized in a condition that the lower surface of the chip is located to be substantially on a level with a chip bonding surface of the substrate. Positioning of the chip and the substrate is performed by the recognition image.

3 Claims, 1 Drawing Sheet

BONDING APPARATUS

This is a continuation of application Ser. No. 10/015,691 filed Dec. 17, 2001 now abandoned. The entire disclosure of the prior application Ser. No. 10/015,691 is hereby incorporated by reference.

FIELD OF THE INVENTION

The present invention relates to an improvement of a bonding apparatus for bonding a chip onto a substrate (including a lead frame and a TAB tape). The present invention has been developed chiefly for the main purpose of chip recognition means in a flip chip bonding apparatus for use in performing positioning of a chip and a substrate.

The present application is based on Japanese Patent Application No. 2000-397163, which is incorporated herein by reference.

DESCRIPTION OF THE RELATED ART

A bonding tool is hitherto designed so that it is moved up after it sucks a chip which is on a chip tray or a wafer, moved relatively and horizontally to be positioned above a substrate, and moved down to bond the chip onto the substrate. As for the image recognition of the chip for performing positioning of the chip and the substrate, the chip is stopped at a raised level at which the chip is moved relatively and horizontally, and the chip is recognized by a chip recognition camera from a position below the chip in order to shorten the tact time.

A ball screw, a guide, or the like, which is a constituent member of a head up-and-down mechanism for moving up and down the bonding tool, may have a slight tilt in its lifting axis (shown by the dotted line in FIG. 3A) due to thermal expansion or the like as the time passes, as shown in FIG. 3A.

On the other hand, the bonding tool is moved up and down along the tilted lifting axis. Thus, strictly speaking, the bonding tool cannot be moved up and down vertically. As a result, even if the chip is moved down toward the substrate from a position a little higher than the level of the chip bonding surface of the substrate which is recognized by the chip recognition camera, the chip will be bonded to a slightly deviated position practically as shown in FIG. 3B.

The larger the distance between the upper surface of the substrate and the level at which the chip is recognized by the chip recognition camera is, the larger the width of this deviation becomes. Such a very small deviation does not matter if a bonding bump size and an allowable deviation width are large as described in the background art. However, when the bonding bump is made small so that the allowable deviation width requires accuracy such as 1 µm or 0.5 µm, such a very small deviation will not be negligible.

SUMMARY OF THE INVENTION

To solve the foregoing problem, an object of the present invention is to provide a bonding apparatus in which recognition of a chip for performing positioning of. the chip and a substrate is carried out in a position in which the chip bonding surface of the substrate is substantially in one and the same plane as the lower surface of the chip, and the positioning of the chip and the substrate is carried out in accordance with a recognition image at a level where the chip is to be bonded to the substrate. Thus, there is no influence of deterioration with the elapse of time (for example, thermal deformation), so that the chip can be positioned on the substrate with high precision.

To attain the foregoing object, the present invention adopts the following apparatus.

A bonding apparatus is constituted by a bonding tool for holding a chip, a substrate stage for mounting a substrate thereon, a moving mechanism for moving the bonding tool and the substrate stage relatively to each other in a horizontal plane, an up-and-down mechanism for moving up and down the bonding tool, and a chip recognition camera for recognizing the chip held by the bonding tool, from a position below the chip.

The bonding apparatus is configured so that the chip and the substrate are subjected to positioning on the basis of a recognition result of the chip recognition camera, and the bonding tool is moved down to bond the chip onto the substrate.

The chip recognition camera is disposed to be lower than a level of a substrate mounted surface of the substrate stage.

A lower surface of the chip is recognized by the chip recognition camera in a condition that the lower surface of the chip is located substantially on a level with a chip bonding surface of the substrate.

The positioning of the chip and the substrate is performed by the recognition image.

Features and advantages of the invention will be evident from the following detailed description of the preferred embodiments described in conjunction with the attached drawings.

BRIEF DESCRIPTION OF THE DRAWINGS

In the accompanying drawings:

FIG. 2A shows the state in which the lower surface of a chip is recognized by the chip recognition camera, and FIG. 2B shows the state in which the chip is bonded onto a substrate; FIG. 3A shows the state in which the lower surface of the chip is recognized by the chip recognition camera, and FIG. 3B shows the state in which deviation is produced.

DETAILED DESCRIPTION OF THE PREFERRED EMBODIMENTS

Figure 1:
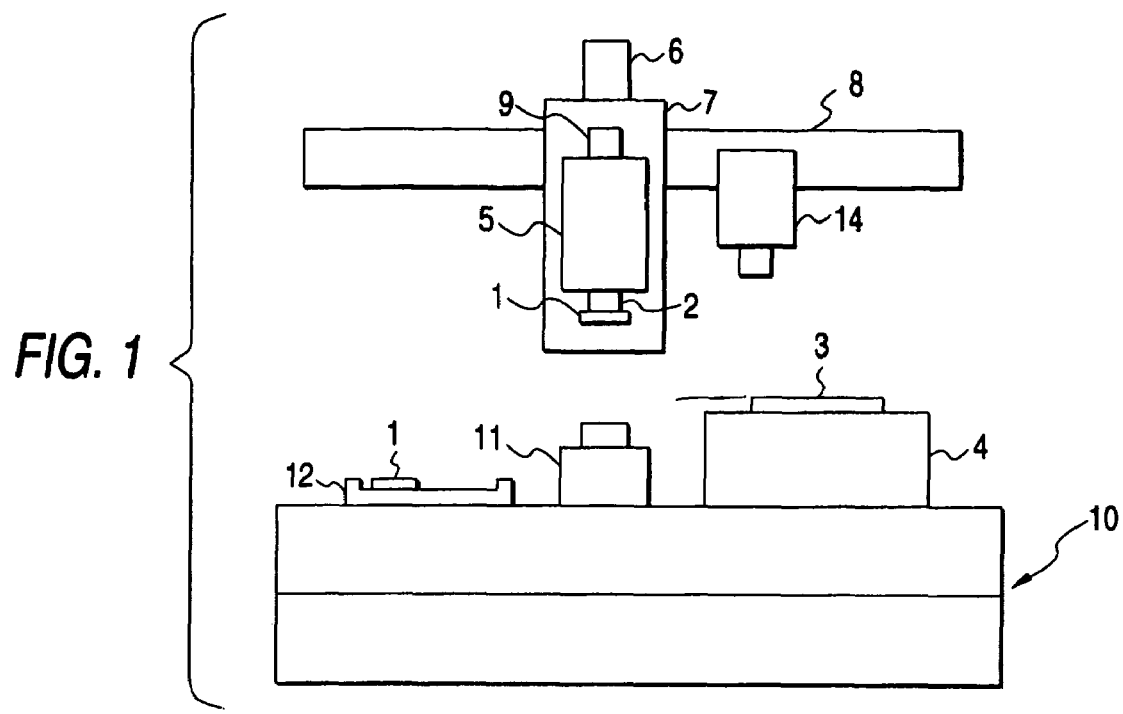
FIG. 1 is a schematic view of a bonding apparatus to which the present invention is applied.

Description will be made below about a mode for carrying out the present invention together with an embodiment illustrated in the drawings. FIG. 1 is a schematic view of a bonding apparatus to which the present invention is applied. The bonding apparatus shown in FIG. 1 is a flip chip bonding apparatus.

The flip chip bonding apparatus has a bonding tool 2 for holding a chip 1, and a substrate stage 4 for mounting a substrate 3 thereon. The chip 1 and the substrate 3 adopted in this embodiment are about 0.3 to 0.5 mm thick respectively. Incidentally, a lead frame, a TAB tape, and so on, are included in the substrate 3.

The bonding tool 2 is attached to a lower end portion of a bonding head 5 as shown in FIG. 1. Incidentally, a not-shown chip suction hole is provided in the bonding tool 2 so that the chip is sucked onto the bonding tool 2 through a connection port by a vacuum apparatus.

The bonding tool 2 is made to move up and down freely together with the bonding head 5 by a Z-axis drive motor 6 and an up-and-down mechanism 7. Though not shown in detail in the drawing, the head up-and-down mechanism 7 is constituted by a ball screw, a guide, and so on, for transmitting the rotation of the Z-axis drive motor 6. The bonding head 5 is supported on a support member 8 so that the bonding head 5 can be moved freely up and down. Incidentally, a substrate recognition camera 14 is installed, while facing downward, on the support member 8.

The bonding head 5 in this embodiment is not provided with a horizontal (front/back direction and left/right direction in the drawings) drive mechanism. Not to say, if the substrate stage 4 is not provided with any moving mechanism such as an XY table 10, the bonding head 5 is required to have a horizontal drive mechanism. Incidentally, the reference numeral 9 in FIG. 1 represents a Θ-axis drive motor for giving a rotor motion to the boding tool 2.

In this embodiment, the XY table 10 is provided as a moving mechanism for moving the bonding tool 2 and the substrate stage 4 relatively to each other in a horizontal plane. The XY table 10 is moved horizontally in one and the same plane by not-shown X-axis and Y-axis drive motors. The substrate stage 4 is installed on the XY table 10.

Together with the substrate stage 4 and a chip tray 12 with another chip 1 received therein, a chip recognition camera 11 for recognizing the chip 1 held by the bonding tool 2 from a position below the chip is supported on the XY table 10. Setting is made so that the position where the chip recognition camera 11 is focused comes to a position which is substantially on a level with the chip bonding surface (upper surface in FIG. 1) of the substrate 3.

The work procedure of the bonding apparatus in this embodiment will be described next.

First, the XY table 10 is moved so that the chip tray 12 receiving the chip 1 is located under the bonding tool 2. Here, the Z-axis drive motor 6 is operated to move the bonding tool 2 down. The chip 1 is sucked on the bonding tool 2, and moved up.

Figure 2A:
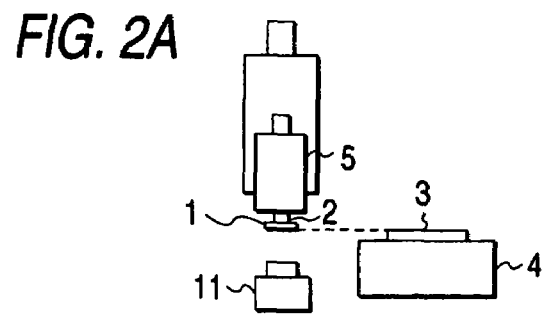
FIGS. 2A and 2B are explanatory views showing the relationship between a bonding tool and a substrate recognition camera.
Figure 2B:
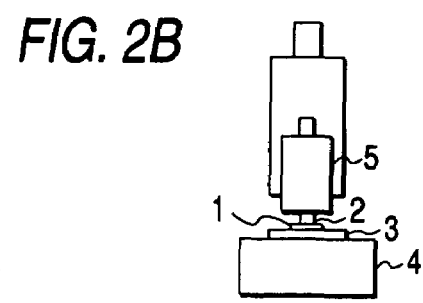
Figure 3A:
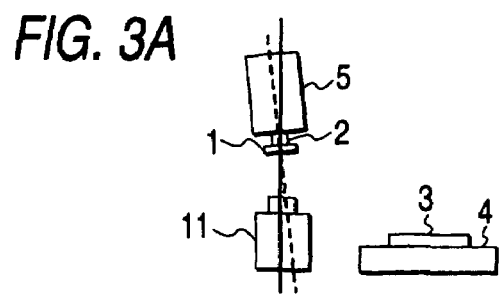
FIGS. 3A and 3B are explanatory views showing the principle on which positional deviation is produced.
Figure 3B:
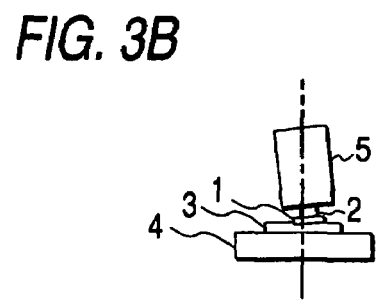

Second, the XY table 10 is moved so that the chip recognition camera 11 is located under the bonding tool 2. After that, as shown in FIG. 2A, the bonding tool 2 is moved down till the lower surface of the chip 1 sucked on the bonding tool 2 reaches a level at which the chip recognition camera 11 is focused. That is, the bonding tool 2 is moved down so that the lower surface of the chip 1 and the chip bonding surface of the substrate 3 are located substantially in one and the same plane.

In this position, an image of the chip 1 sucked on the bonding tool 2 is recognized by the chip recognition camera 11. After the position of the chip 1 is confirmed, the bonding tool 2 is moved up.

Third, the XY table 10 is moved so that the substrate 3 is located under the substrate recognition camera 14. An image of the substrate 3 is recognized in the position where the substrate 3 and the chip 1 are to be bonded. Thus, the bonding position is recognized. As a result, the chip bonding surface of the substrate 3 and the lower surface of the chip 1 are recognized substantially at one and the same level.

Fourth, the quantity of movement with which the XY table 10 should be moved to perform the positioning of the chip 1 and the substrate 3 fitly to each other is obtained on the basis of the recognition results of the chip recognition camera 11 and the substrate recognition camera 14. Then, the XY table 10 is moved to perform the positioning of the chip 1 and the substrate 3. At this time, the Θ-axis drive motor 9 is operated to rotate the bonding tool 2 in accordance with necessity.

Fifth, the bonding tool 2 is moved down to bond the chip 1 onto the substrate 3, and the bonding tool 2 is moved up. At this time, even if there arises a deviation in the lifting axis of the bonding tool 2, the substrate 3 and the chip 1 can be bonded accurately without deviation because the positioning of the substrate 3 and the chip 1 is performed on the basis of image recognition in the position where the substrate 3 and the chip 1 should be bonded to each other.

Incidentally, though it also depends on the structure of the head up-and-down mechanism 7 and the material of a guide and so on provided in the head up-and-down mechanism 7, the deviation will be not larger than 1 μm if an error between the level of the lower surface of the chip 1 and the level of the chip bonding surface of the substrate 3 at the time of the image recognition is within ±5 mm.

In addition, if the chip tray 12 is located to be lower than the level at which the chip recognition camera 11 is focused, that is, if the chip tray 12 is in a position lower than the level of the chip bonding surface of the substrate 3, the bonding tool 2 maybe moved up to the level at which the chip recognition camera 11 is focused (the level of the chip bonding surface of the substrate 3) after the chip bonding tool 2 has sucked the chip 1 from the chip tray 12. In this case, the operation for moving the bonding tool 2 down in the above-mentioned second step can be omitted.

The present invention exhibits the following effect due to its configuration as described above.

According to the present invention, a chip recognition camera is disposed to be lower than the level of a substrate mounted surface of a substrate stage while the lower surface of a chip is positioned to be almost on a level with the chip bonding surface of a substrate. In this state, the lower surface of the chip is recognized by a chip recognition camera, and the positioning of the chip and the substrate is performed. Thus, it is possible to provide a bonding apparatus in which the influence of deterioration with the passage of time (for example, thermal deformation) can be eliminated so that positioning can be carried out with high precision.

Although the invention has been described in its preferred "form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method for bonding a chip to a substrate comprising:
   holding a chip by a bonding tool;
   recognizing said chip held by said bonding tool from a position below said chip by a chip recognition camera disposed to be lower than a level of a substrate mounting surface of said substrate stage;
   wherein the recognizing said chip held by said bonding tool comprises recognizing the lower surface of said chip by the chip recognition camera as the chip moves substantially on a level with a chip bonding surface of said substrate;
   recognizing said substrate mounted on a substrate stage by a substrate recognition camera disposed above said substrate stage;
   positioning said chip and said substrate on the basis of recognition results of said chip recognition camera and said substrate recognition camera; and
   bonding said chip to said substrate.

2. The method for bonding a chip to a substrate according to claim 1, further comprising setting said chip recognition camera to a position where said chip recognition camera is focused on a position which is substantially on a level with said bonding surface of said substrate.

3. The method for bonding a chip to a substrate according to claim 1, further comprising providing a supply of chips in a chip tray that is disposed so as to be lower than the level of said chip bonding surface of said substrate.

* * * * *